(12) United States Patent
Takagi (10) Patent No.: US 8,159,311 B2
(45) Date of Patent: Apr. 17, 2012

(54) HIGH FREQUENCY PACKAGE AND MANUFACTURING METHOD THEREOF

(75) Inventor: Kazutaka Takagi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 399 days.

(21) Appl. No.: 12/507,287

(22) Filed: Jul. 22, 2009

(65) Prior Publication Data

US 2010/0060373 A1 Mar. 11, 2010

(30) Foreign Application Priority Data

Sep. 8, 2008 (JP) ................................ 2008-229752

(51) Int. Cl.
*H01L 23/12* (2006.01)
*H04B 3/28* (2006.01)
*H01P 11/00* (2006.01)

(52) U.S. Cl. ......................................... 333/12; 361/820
(58) Field of Classification Search .................... 333/12, 333/208, 210, 211; 361/820; 257/728, 729, 257/703, 704
See application file for complete search history.

(56) References Cited

U.S. PATENT DOCUMENTS

| | | | | |
|---|---|---|---|---|
| 5,119,266 A | * | 6/1992 | Petry ............................. | 361/111 |
| 2007/0007647 A1 | | 1/2007 | Takagi | |
| 2007/0290335 A1 | | 12/2007 | Takagi | |

FOREIGN PATENT DOCUMENTS

| | | |
|---|---|---|
| JP | 2001-196500 | 7/2001 |
| JP | 2002-289720 | 10/2002 |

OTHER PUBLICATIONS

U.S. Appl. No. 12/579,023, filed Oct. 14, 2009, Takagi, et al.

* cited by examiner

*Primary Examiner* — Stephen Jones
(74) *Attorney, Agent, or Firm* — Oblon, Spivak, McClelland, Maier & Neustadt, L.L.P.

(57) ABSTRACT

A high frequency package in which the resonance frequency of a metal seal ring is high, a reflection loss and a insertion loss of an input terminal and an output terminal are reduced in working frequency, and which has an excellent RF (radio frequency) characteristic in such as a millimeter wave, and a manufacturing method for the same are provided. The high frequency package has a minimum of an conductor base plate, a ceramic frame, the metal seal ring arranged on the ceramic frame, a solder metal layer arranged on the metal seal ring, a resonance frequency adjustment conductor formed of a conductor having an opening arranged on the solder metal layer, and a ceramic cap arranged on the resonance frequency adjustment conductor. The resonance frequency adjustment conductor is arranged so that an opening may correspond to a high portion of a loop of bonding wire.

13 Claims, 12 Drawing Sheets

HIGH FREQUENCY PACKAGE AND MANUFACTURING METHOD THEREOF

CROSS REFERENCE TO RELATED APPLICATION

This application is based upon and claims the benefit of priority from Japanese Patent Application No. 2008-229752, filed on Sep. 8, 2008, the entire contents of which are incorporated herein by reference.

FIELD OF THE INVENTION

The present invention relates to a high frequency package and a manufacturing method thereof, and relates especially to a high frequency package suitable for a semiconductor device used in a microwave band, and a manufacturing method thereof.

DESCRIPTION OF THE BACKGROUND

A high-frequency power amplifier, for example, a microwave power amplifier, includes active devices, such as an electric field effect type transistor, passive components, such as a resistor and a capacitor, and circuit elements, such as a microstripline which transmits a high frequency signal. The circuit element of such a microwave power amplifier is mounted on a high frequency package as exemplified in U.S. Pat. No. 5,692,298 and JP, P2000-510287A.

As for the high frequency package shown in U.S. Pat. No. 5,692,298 and JP, P2000-510287A, a resonance frequency of a seal ring is determined by the length of the seal ring. If the resonance frequency becomes equal to the working frequency of the package, isolation between an input terminal and an output terminal which are provided under the seal ring will be affected.

JP, P2001-196500A and JP, P2002-289720A discloses the structure of a high frequency package for avoiding resonance of a seal ring in a working frequency.

In JP, P2001-196500A, the seal ring on a side wall is grounded via penetration holes. The resonance can be avoided by providing many through holes, however, this is costly.

In JP, P2002-289720A, to avoid the resonance, a metalized layer is formed all over the rear face of a cap. Resonance can be avoided by making the cap with metal or forming a metalized layer on the rear face of the cap, however, the frequency characteristic of a wire inside a cavity is problematic.

SUMMARY OF THE INVENTION

A high frequency package according to one embodiment of the present invention includes a conductor base plate, a ceramic frame arranged on the conductor base plate, a metal seal ring arranged on the ceramic frame, a solder metal layer arranged on the metal seal ring, a resonance frequency adjustment conductor arranged on the solder metal layer having a plurality of openings, being electrically connected to the metal seal ring, and a ceramic cap arranged on the resonance frequency adjustment conductor.

A manufacturing method of a high frequency package according to one embodiment of the present invention includes forming a ceramic frame on a conductor base plate, forming a metal seal ring on the ceramic frame, and forming a ceramic cap formed with a resonance frequency adjustment conductor which is a conductor having a plurality of openings on the metal seal ring via a solder metal layer.

DETAILED DESCRIPTION OF THE INVENTION

Hereafter, an embodiment of the present invention is described with reference to drawings. Same numeral is given to the same element and duplication of explanation is avoided. The drawings are schematic diagrams and it should be noted that the drawings differ from the actual. Of course, a portion from which a mutual size and ratio differ among the drawings is contained.

The embodiment shown below describes a device and a method for realizing a technical idea of this invention, and the embodiment does not specify each component parts as follows. Each component parts can be used independently and with various changes within the scope of the claim.

Figure 1:
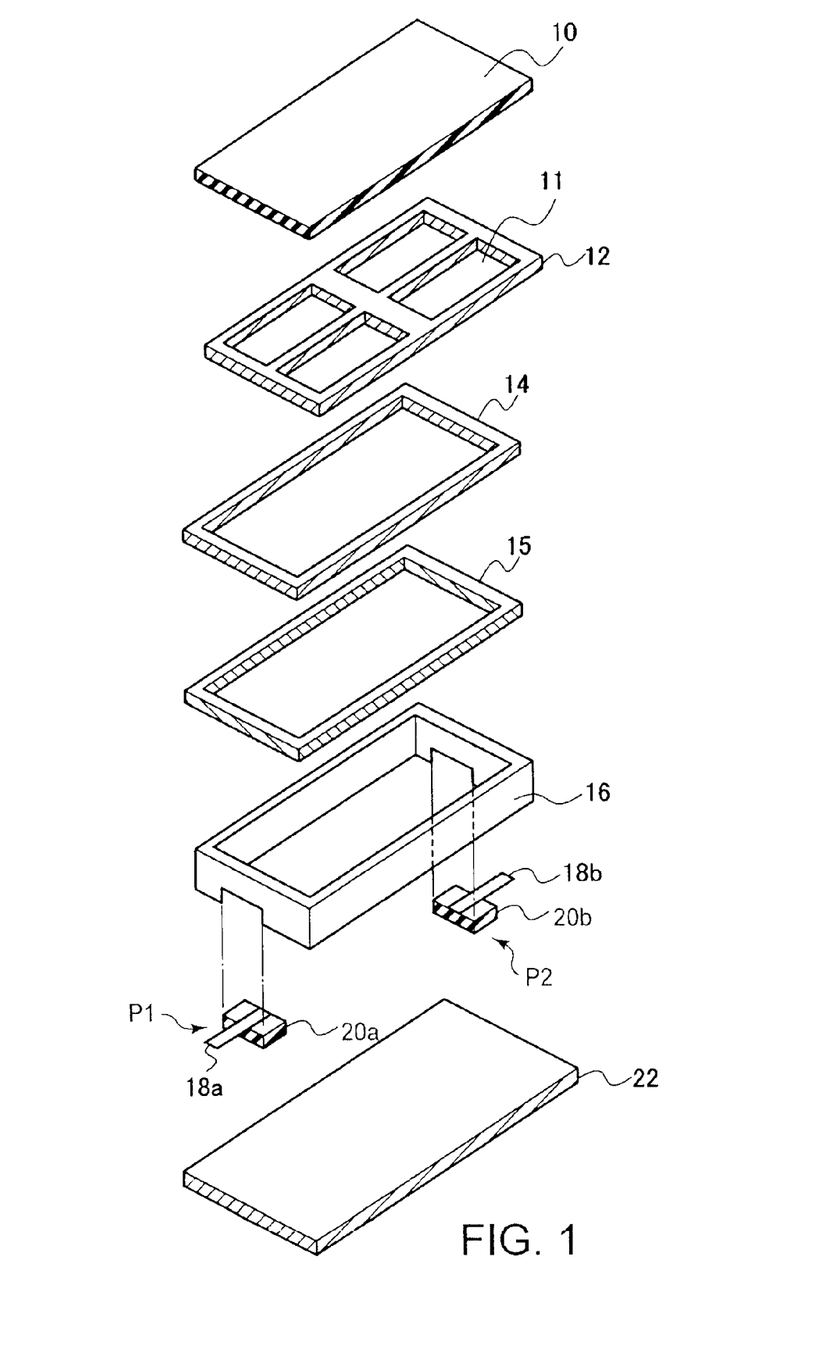
FIG. 1 is an exploded perspective view illustrating a high frequency package concerning an embodiment.

FIG. 1 is an exploded perspective view illustrating the high frequency package concerning one embodiment of the present invention.

The high frequency package includes conductor base plate 22, ceramic frame 16, input terminal P1, output terminal P2, metal seal ring 15, solder metal layer 14, resonance frequency adjustment conductor 12, and ceramic cap 10 as shown in FIG. 1.

(Conductor Base Plate 22)

Conductor base plate 22 is formed of a conductive metal, such as Kovar, copper, a copper tungsten alloy, a copper molybdenum alloy, and molybdenum. A plated conductor of nickel, silver, and a silver-platinum alloy, a silver-palladium alloy, and gold, for example, may be formed on a surface of conductor base plate 22.

(Ceramic Frame 16)

Ceramic frame 16 is formed from alumina (Al2O3), aluminum nitride (AlN), beryllium oxide (BeO), for example.

Metal seal ring 15 is formed on an upper surface of ceramic frame 16. Metal seal ring 15 may be a metalized layer formed on the upper surface of ceramic frame 16.

Input terminal P1 has insulating layer 20a and input stripline 18a arranged thereon. Output terminal P2 has insulating layer 20b and output stripline 18a arranged thereon.

Ceramic frame 16 is arranged on and fixed to conductor base plate 22 via insulating adhesive or conductive adhesive. The insulating adhesive can be formed from epoxy resin, glass, or a similar insulating adhesive substance and the conductive adhesive can be formed from silver solder, a golden germanium alloy, a gold tin alloy, or a similar conductive adhesive substance. When ceramic frame 16 and conductor base plate 22 are fixed, input terminal P1 and output terminal P2 are fixed to ceramic frame 16 and conductor base plate 22 with the insulating or conductive adhesive.

In a space formed by conductor base plate 22 and ceramic frame 16A, a semiconductor element, an input circuit board, and an output circuit board (not shown but incorporated herein) are arranged in a manner so that they are connected at a minimum by a bonding wire.

(Solder Metal Layer 14)

Solder metal layer 14 is a solder which solders a resonance frequency adjustment conductor 12 and metal seal ring 15. Solder metal layer 14 can be formed of a gold germanium alloy, a gold tin alloy or a similar substance.

(Ceramic Cap 10)

Ceramic cap 10 is a flat plate shape and resonance frequency adjustment conductor 12 is formed on a rear face thereof. Resonance frequency adjustment conductor 12 is a conductor which has a plurality of openings 11, and is a conductor in which a metalized layer attached on the rear face of ceramic cap 10 is formed in a grid shape, for example.

Ceramic cap 10 is not restricted to a plate-like shape and a box-like shape with one opening at one side may be used as ceramic cap 10. Also as for those ceramic caps 10, resonance frequency adjustment conductor 12 is arranged on the rear face thereof.

After the necessary wire connection among the semiconductor element, the input circuit board, the output circuit board is formed, ceramic cap 10 on which resonance frequency adjustment conductor 12 is formed is arranged on metal seal ring 15 adhered to ceramic frame 16 via solder metal layer 14.

By soldering resonance frequency adjustment conductor 12 and metal seal ring 15 with solder metal layer 14, ceramic cap 10 is fixed to ceramic frame 16 via resonance frequency adjustment conductor 12, solder metal layer 14 and metal seal ring 15. Thereby, an internal space is created by such seal and the high frequency package is formed. Resonance frequency adjustment conductor 12 is electrically connected with metal seal ring 15 by solder metal layer 14.

Resonance frequency adjustment conductor 12 may be formed apart from ceramic cap 10. In this case, after unifying resonance frequency adjustment conductor 12 and ceramic cap 10 beforehand, resonance frequency adjustment conductor 12 is adhered to metal seal ring 15. Or, pursuant to an alternative, after adhering resonance frequency adjustment conductor 12 to metal seal ring 15, ceramic cap 10 is adhered to resonance frequency adjustment conductor 12.

In the high frequency package according to the embodiment, the bonding wires which connect the semiconductor element and the input circuit board, and the bonding wires which connect the semiconductor element and the output circuit board are arranged so that a high portion of a loop may correspond to opening 11 of resonance frequency adjustment conductor 12.

The high frequency package concerning the embodiment has a high frequency characteristic which is greater than 3 GHz, and can be applied as a package for device that operates frequencies over 3 GHz.

Figure 2:
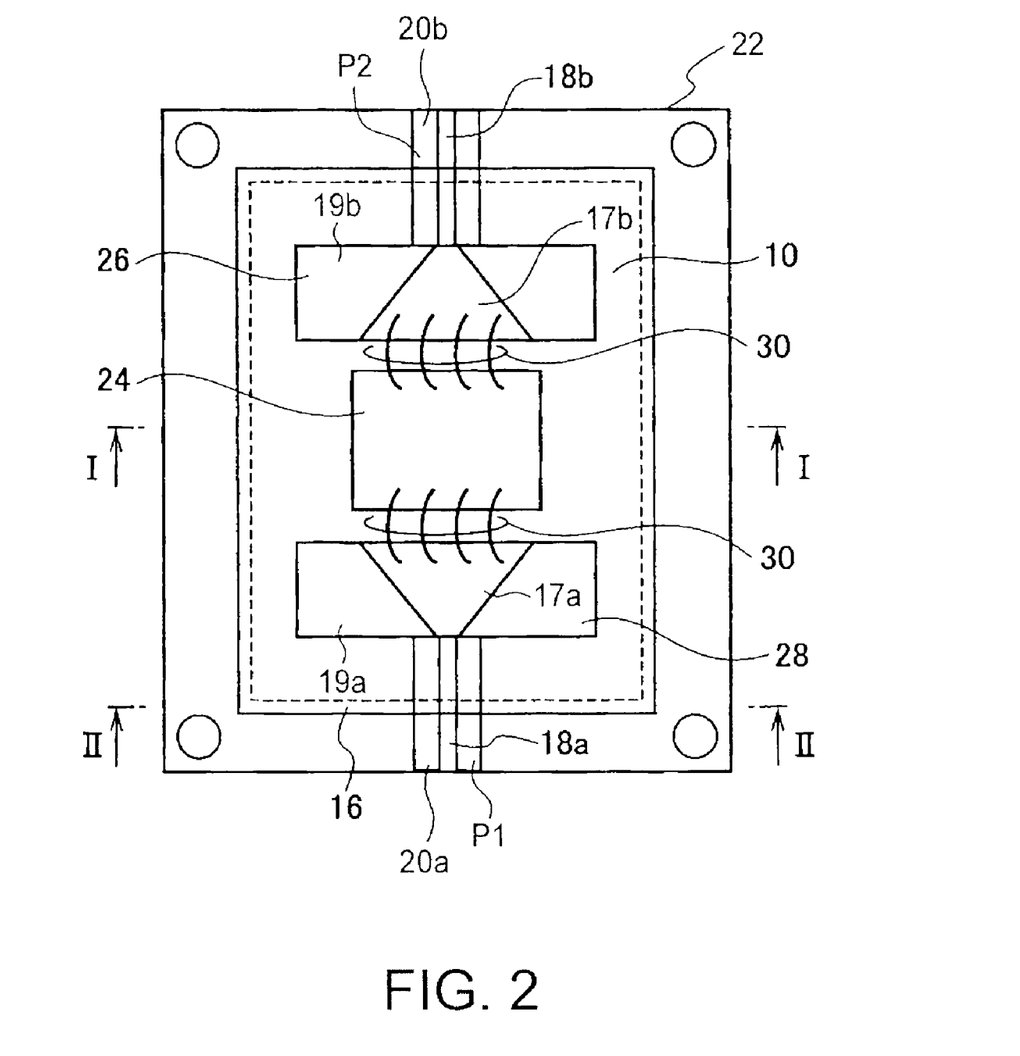
FIG. 2 is a top view illustrating the high frequency package concerning the embodiment.
Figure 3A:
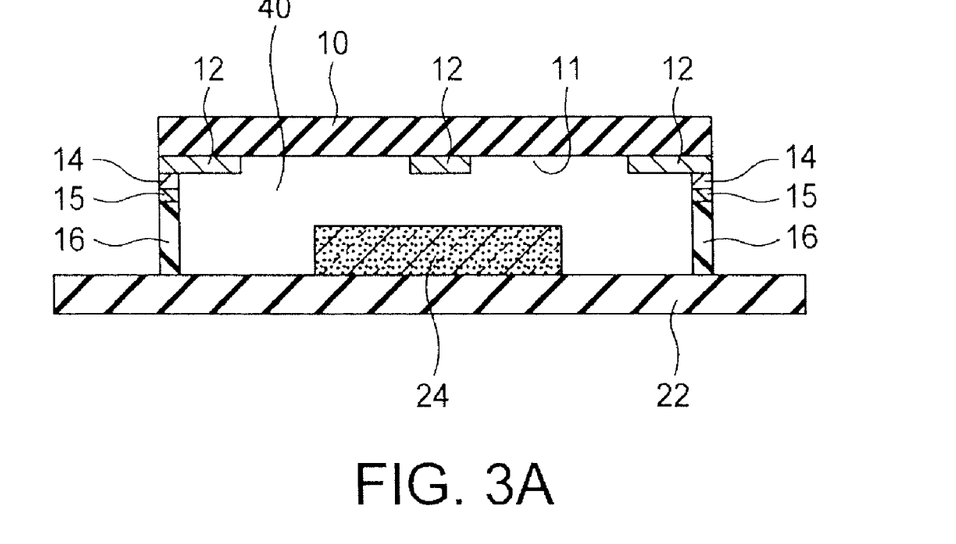
FIG. 3A is a cross-sectional view along I-I line of FIG. 2.
Figure 3B:
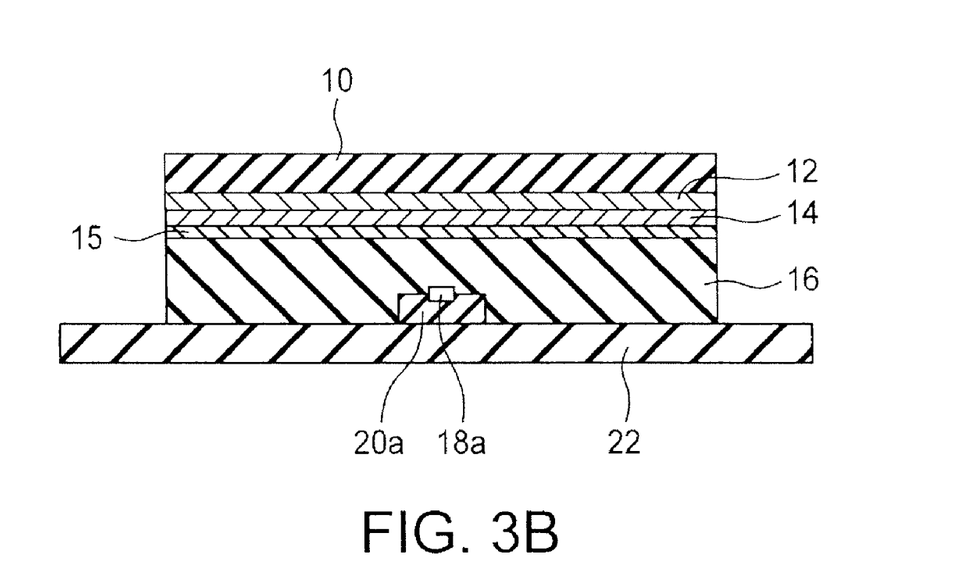
FIG. 3B is a cross-sectional view along II-II line of FIG. 2.

FIG. 2 shows the top view of the high frequency package concerning the embodiment. FIG. 3A shows the cross-sectional view along I-I line of FIG. 2. FIG. 3B shows the cross-sectional view along II-II line of FIG. 2.

As shown in FIGS. 2, 3A and 3B, in the high frequency package concerning the embodiment, ceramic frame 16 is formed on conductor base plate 22. In an area surrounded by ceramic frame 16, semiconductor element 24, input circuit board 28 and output circuit board 26 are arranged on conductor base plate 22. Input circuit board 28 is arranged at an input side of semiconductor element 24, and output circuit board 26 is arranged at an output side of semiconductor element 24. Input circuit board 28 has insulating substrate 19a, for example, a ceramic substrate and an input matching circuit 17a arranged thereon. Output circuit board 26 has insulating substrate 19b, for example, a ceramic substrate and an output matching circuit 17b arranged thereon.

Input terminal P1 and output terminal P2 which penetrate ceramic frame 16 are incorporated in ceramic frame 16. Input terminal P1 has insulating layer 20a and input stripline 18a arranged thereon. Output terminal P2 has insulating layer 20b and output stripline 18b arranged thereon.

Input matching circuit 17a is connected with input stripline 18a at one end and is connected to an input terminal (gate terminal) of semiconductor element 24 by bonding wire 30 at the other end. Output matching circuit 17b is connected with output stripline 18b at one end and is connected to an output terminal (drain terminal) of semiconductor device 24 by bonding wire 30 at the other end. Opening 11 of resonance frequency adjustment conductor 12 is formed corresponding to a position of bonding wire 30.

Ceramic cap 10 on which resonance frequency adjustment conductor 12 is formed is soldered to metal seal ring 15 which is fixed on ceramic frame 16 by solder metal layer 14.

Thereby, cavity 40 is formed from conductor base plate 22, ceramic frame 16 and ceramic cap 10 arranged on ceramic frame 16 via metal seal ring 15, solder metal layer 14 and resonance frequency adjustment conductor 12.

(Castellation 15a)

Figure 4:
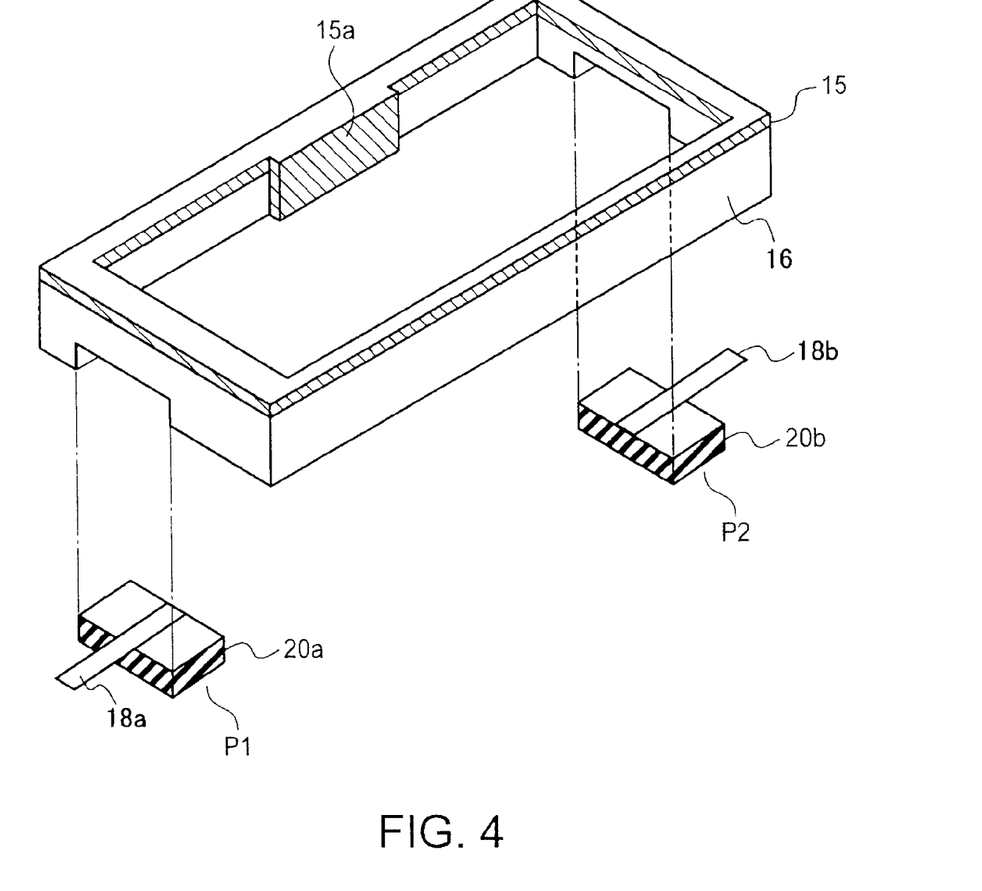
FIG. 4 is a perspective view illustrating a castellation.

The high frequency package concerning the embodiment may be provided with castellation 15a arranged on an inner side wall of ceramic frame 16 as shown in FIG. 4. Castellation 15a comprises a conductor, connects conductor base plate 22 with metal seal ring 15 electrically, and grounds metal seal ring 15 to conductor base plate 22.

By castellation 15a, resonance frequency adjustment conductor 12 is also grounded via metal seal ring 15 and solder metal layer 14.

Although the resonance by metal seal ring 15 in working frequency can be reduced by castellation 15a, parasitic effect between bonding wire 30 and resonance frequency adjustment conductor 12 appears more notably. However, in the high frequency package concerning the embodiment, since resonance frequency adjustment conductor 12 has opening 11, the parasitic effect produced between bonding wire 30 and resonance frequency adjustment conductor 12 can be reduced. In this case, position of bonding wire 30 and opening 11 of resonance frequency adjustment conductor 12 is important.

(Resonance Frequency Adjustment Conductor 12)

Resonance frequency adjustment conductor 12 comprises of a conductor in the shape of a grid which has a plurality of openings 11. Opening 11 is not restricted to a rectangular shape, it may also be a circular shape, an elliptic shape, a hexagonal shape, an octagonal shape or any other shape found to maximize resonance efficiency.

Figure 5A:
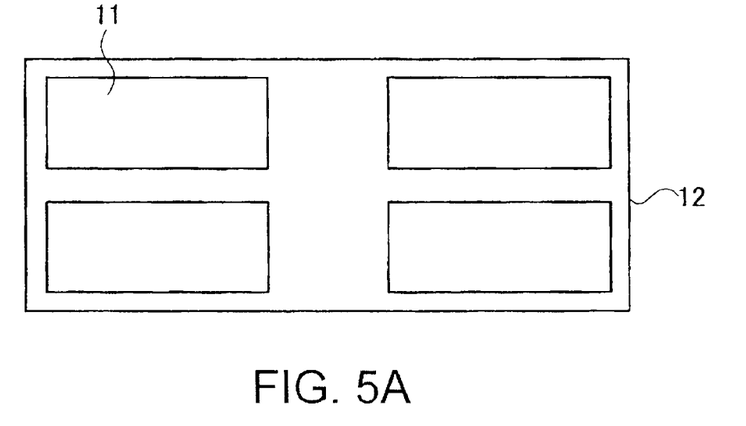
FIG. 5A is a top view illustrating a resonance frequency adjustment conductor.
Figure 5B:
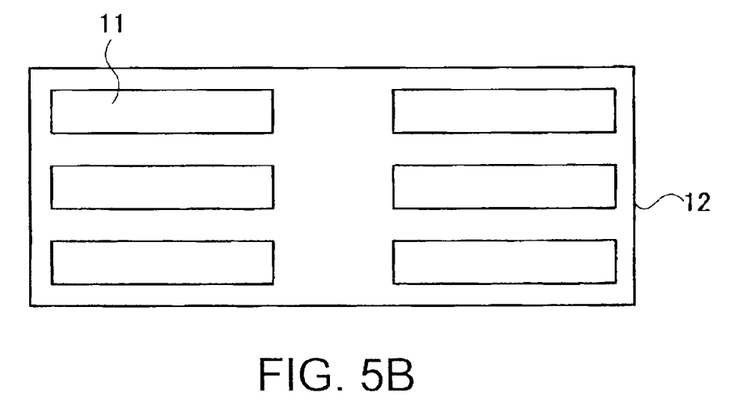
FIG. 5B is a top view of other resonance frequency adjustment conductor.
Figure 5C:
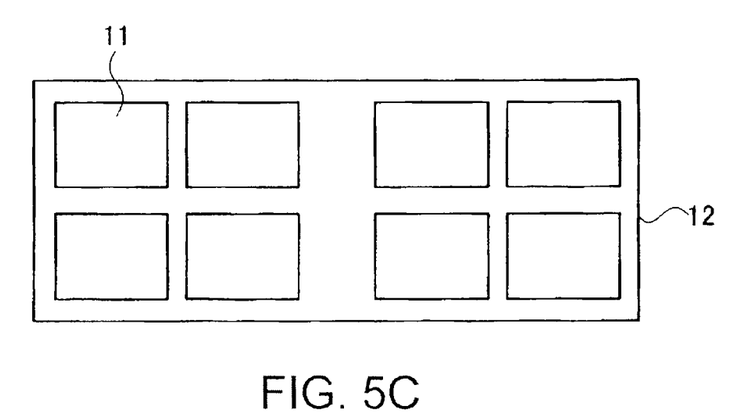
FIG. 5C is a top view of an example resonance frequency adjustment conductor.

FIG. 5A shows resonance frequency adjustment conductor 12 which has four rectangular openings 11. FIG. 5B shows resonance frequency adjustment conductor 12 which has six rectangular openings 11. FIG. 5C shows resonance frequency adjustment conductor 12 which has eight rectangular openings 11.

Figure 6A:
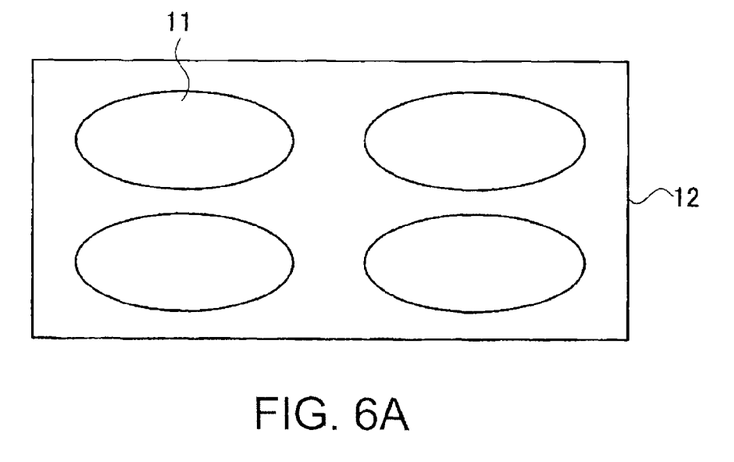
FIG. 6A is a top view of an example resonance frequency adjustment conductor.
Figure 6B:
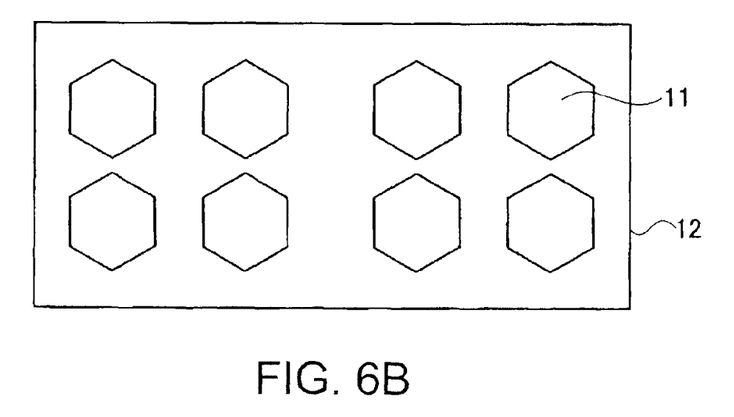
FIG. 6B is a top view of an example resonance frequency adjustment conductor.
Figure 6C:
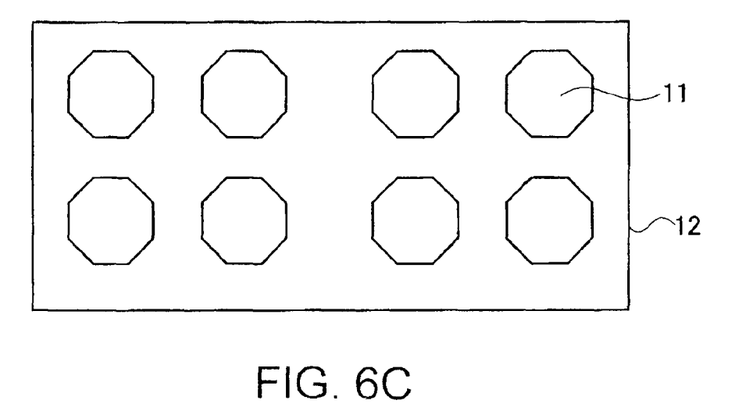
FIG. 6C is a top view of an example resonance frequency adjustment conductor of other example.

Drawing 6A shows resonance frequency adjustment conductor 12 which has four elliptic openings 11. FIG. 6B shows resonance frequency adjustment conductor 12 which has eight hexagonal openings 11. FIG. 6C shows resonance frequency adjustment conductor 12 which has eight octagonal openings 11.

Resonance frequency adjustment conductor 12 is not limited to the grid patterns as shown in FIG. 5A through FIG. 6C due to the fact that similar effect is acquired by any grid patterns.

(Relation Between Resonance Frequency Adjustment Conductor 12 and Bonding Wire 30)

Figure 7:
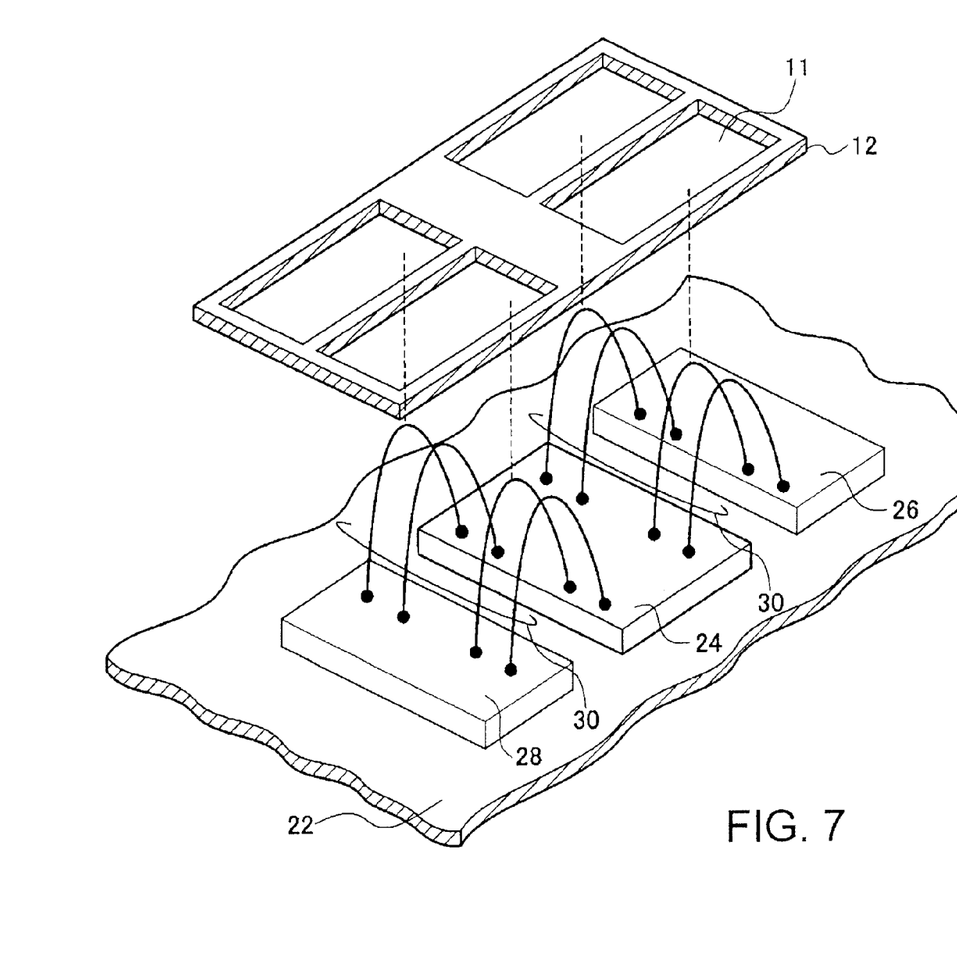
FIG. 7 is a perspective view illustrating positional relationship between the resonance frequency adjustment conductor, a bonding wire which connects among a semiconductor element, an input circuit board, and an output circuit board.

FIG. 7 is a drawing illustrating the positional relationship between resonance frequency adjustment conductor 12 and bonding wire 30 which connects semiconductor element 24 and input circuit board 28 or output circuit board 26.

As for a relation between the pattern pitch of the grid of resonance frequency adjustment conductor 12 and a frequency, a high frequency package applicable to higher frequency is obtained when a loop of a grid becomes small. On the other hand, if the grid becomes fine and becomes close to a metalized layer formed on the whole surface, the parasitic effect between bonding wire 30 and resonance frequency adjustment conductor 12 will appear notably, and bonding wire 30 will be negatively affected.

Therefore, as shown in FIG. 7, opening 11 of resonance frequency adjustment conductor 12 is formed corresponding to the position of bonding wire 30 between semiconductor device 24 and input circuit board 28 arranged on conductor base plate 22, and the position of bonding wire 30 between semiconductor device 24 and output circuit board 26. That is, resonance frequency adjustment conductor 12 is formed so that opening 11 may correspond to the high portion of the loop of bonding wire 30.

Since an effective inductance will deteriorate if bonding wire 30 is placed close to resonance frequency adjustment conductor 12, influence arises in the frequency characteristic. In order to avoid this, it is desirable that the loop shape bonding wire 30 is not placed close to resonance frequency adjustment conductor 12.

(Parasitic Effect)

Figure 8:
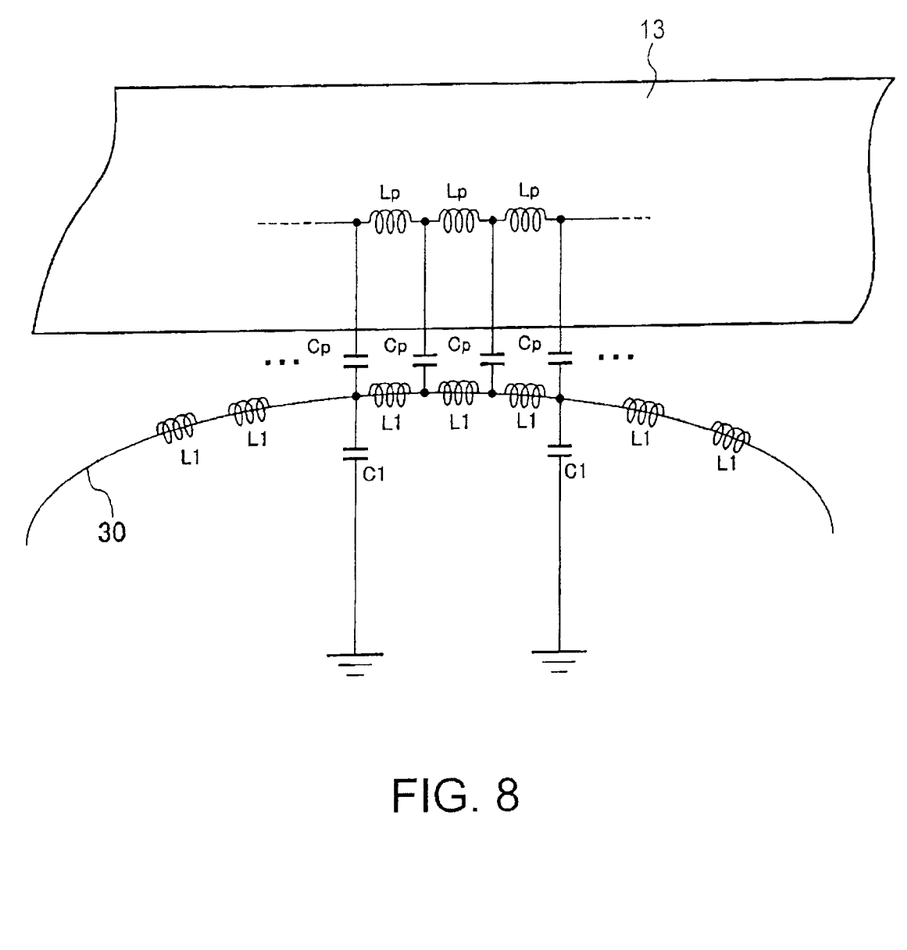
FIG. 8 is a drawing illustrating the parasitic effect formed between a metal layer without an opening and the bonding wire.
Figure 9:
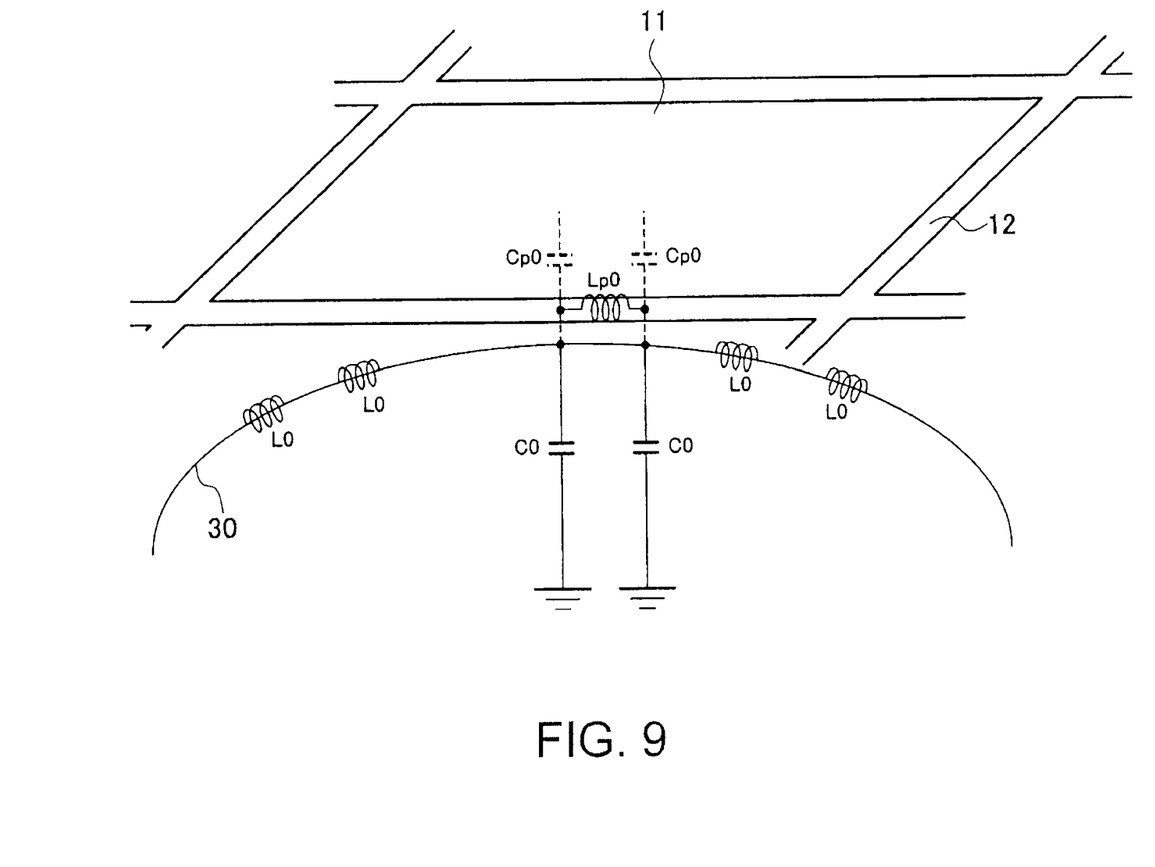
FIG. 9 is a drawing illustrating parasitic effect formed between the resonance frequency adjustment conductor and the bonding wire.

FIG. 8 is a drawing illustrating the parasitic effect formed between bonding wire 30 and conductor 13 without opening 11. FIG. 9 is a drawing illustrating the parasitic effect formed between bonding wire 30 and resonance frequency adjustment conductor 12 which has opening 11.

As shown in FIG. 8, conductor 13 without opening 11 can be considered as the same as a ground conductor plate. If bonding wire 30 approaches conductor 13, the distributed constant circuit which comprises parasitic distributed capacitance Cp formed between bonding wire 30 and conductor 13 and parasitic distributed inductance Lp other than distributed inductance L1 which bonding wire 30 has and distributed capacitance C1, is formed. For this reason, a coupling state of a high frequency between bonding wire 30 and conductor 13 occurs, and a leakage current of high frequency flows into conductor 13 from bonding wire 30.

As resonance frequency adjustment conductor 12 which has opening 11 is shown in FIG. 9, a ground conductor does not exist in opening 11.

Therefore, even if bonding wire 30 approaches resonance frequency adjustment conductor 12, the distributed constant circuit which comprises only slight parasitic distributed capacitance Cp0 between bonding wire 30 and resonance frequency adjustment conductor 12 and only slight parasitic distributed inductance Lp0, other than distributed inductance L1 which wire bonding 30 has and distributed capacitance C1, is formed. For this reason, an occurrence of the coupling state of high frequency between bonding wire 30 and resonance frequency adjustment conductor 12 is suppressed, and the leakage current of high frequency hardly flows into resonance frequency adjustment conductor 12 from bonding wire 30.

(Standing Wave)

Figure 10:
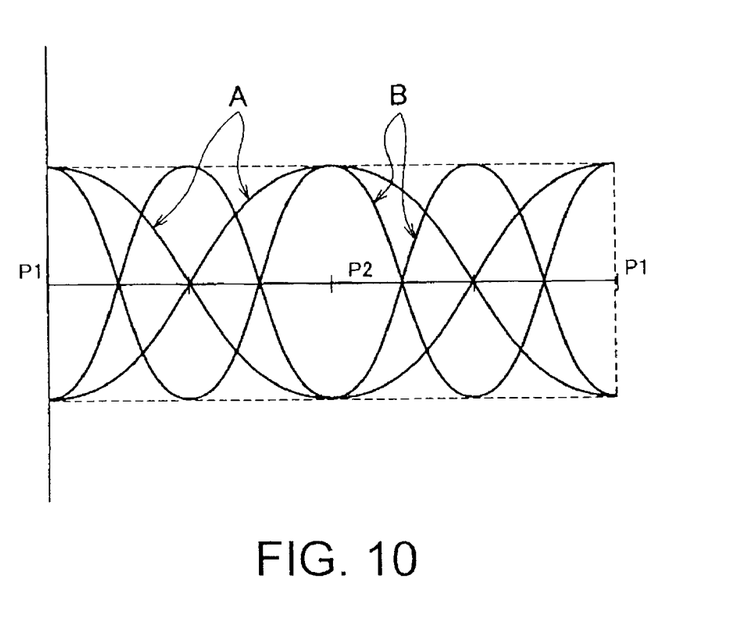
FIG. 10 is a drawing illustrating operation of a high frequency package of prior art.

FIG. 10 is a drawing illustrating operation of a conventional high frequency package which does not have a metalized layer on the rear face of the ceramic cap. A waveform of a standing wave transmitted between input terminal P1 and output terminal P2 is illustrated schematically while a horizontal axis is set as a time-axis and input terminal P1 and output terminal P2 are set as anti-nodes.

Waveform A and waveform B show standing wave mode.

If a circumference length of metal seal ring 15 becomes equal to wavelength λ corresponding to working frequency f of semiconductor element 24, resonance will occur and isolation between input terminal P1 and output terminal P2 which are provided under metal seal ring 15 will be spoiled. That is, if the circumference length of metal seal ring 15 becomes equal to wavelength λ, the conditions in which the standing wave uses input terminal P1 and output terminal P2 as anti-nodes can exist become ready. In a condition where input terminal P1 and output terminal P2 is not connected, the signal transmissibility is ideally zero. However, if resonance occurs, a signal which should be made to transmit only to a circuit connected originally or a wiring will be transmitted to another terminal via metal seal ring 15.

Figure 11:
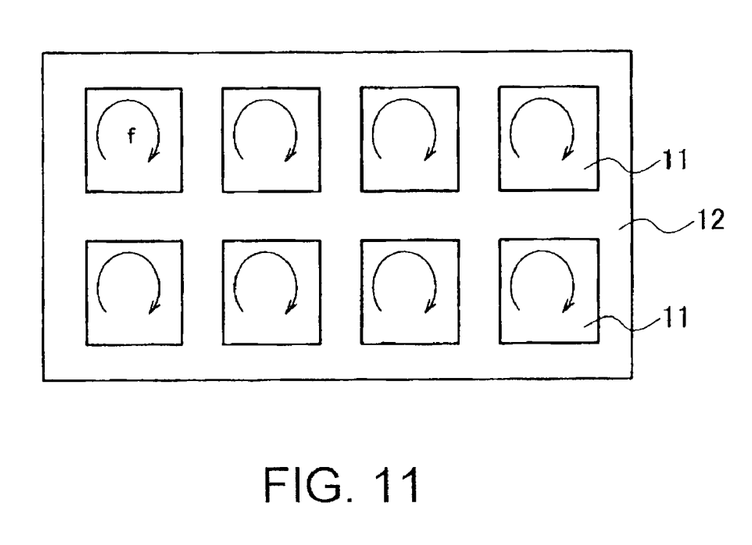
FIG. 11 is a top view illustrating an example of the resonance frequency adjustment conductor of the high frequency package concerning the embodiment.

FIG. 11 shows resonance frequency adjustment conductor 12 of the high frequency package concerning this embodiment. By having eight rectangular opening 11, resonance frequency adjustment conductor 12 creates a high resonance frequency f of metal seal ring 15. That is, resonance frequency f of resonance frequency adjustment conductor 12 is raised, and resonant wavelength λ of metal seal ring 15 is substantially made smaller.

Wavelength λ is expressed by $\lambda = C/(f \cdot \varepsilon_r)$. Wherein, the specific permittivity of ceramic frame 16 is $\varepsilon_r$, the parasitic capacitance which resonance frequency adjustment conductor 12 has is C, and the resonance frequency is f.

(Experimental Result)

Figure 12:
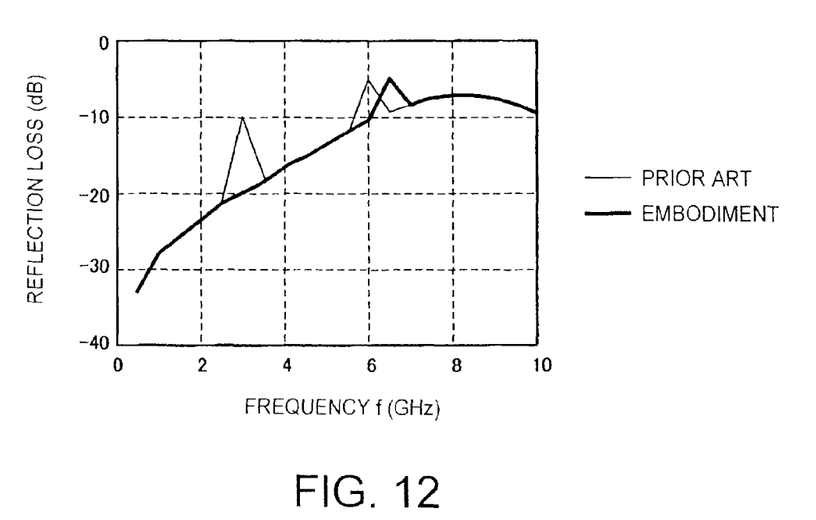
FIG. 12 is a drawing illustrating relation between a reflection loss and a frequency of the high frequency package.
Figure 13:
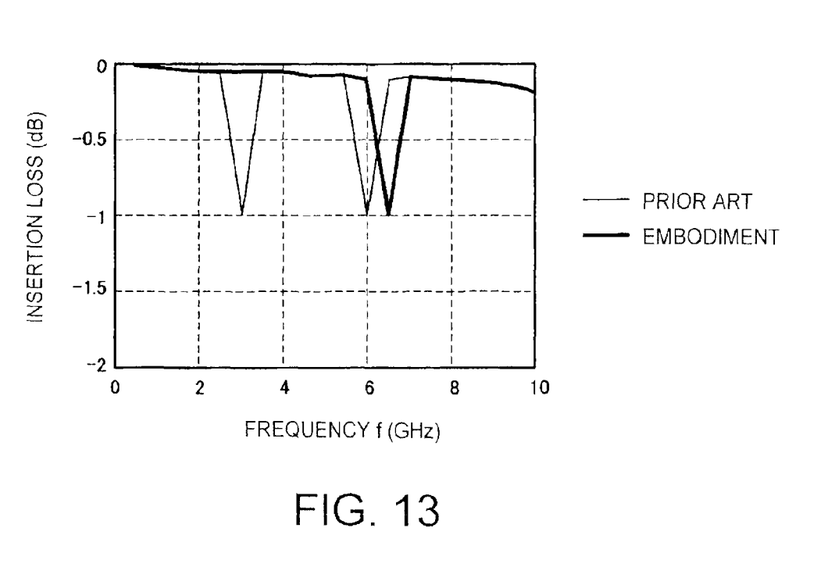
FIG. 13 is a drawing illustrating the relation between an insertion loss and a frequency of the high frequency package.

FIG. 12 shows a relation between a reflection loss and a frequency in a condition where the terminals of the high frequency package are connected with a lossless transmission line which matches to those terminals. FIG. 13 shows a relationship between an insertion loss and a frequency in a condition where the terminals of the high frequency package are connected with the lossless transmission line which matches to the terminals. Prior art is a high frequency package which does not have a metalized layer on its rear face of the ceramic cap. The embodiment is the high frequency package which has resonance frequency adjustment conductor 12 having rectangular opening 11 shown in FIG. 9.

A reflection loss is a loss caused by electric power being reflected in one terminal face and electric power not being transferred to other terminal. Ideally, the terminal becomes non-reflective. However, as shown in FIG. 12, in the high frequency package of the prior art, a fundamental wave peak appears at about 3 GHz, and a secondary harmonics peak appears at 6 GHz. In the high frequency package concerning the embodiment, a fundamental wave peak appears at about 6.5 GHz, and a secondary harmonics peak appears at 13 GHz (illustration is omitted). This is because the isolation between input terminal P1 and output terminal P2 is spoiled as abovementioned. In the prior art, metal seal ring 15 resonates at relatively low frequency, and the fundamental wave peak and the secondary harmonics peak appear at relatively low frequency. On the other hand, according to resonance frequency adjustment conductor 12 concerning the embodiment, since resonance frequency f can be raised, the fundamental wave peak and the secondary harmonics peak are obtained at relatively high frequency.

The insertion loss corresponds to the space propagation characteristic in the cavity. As shown in FIG. 13, in the prior art, a fundamental wave peak appears at about 3 GHz, and a secondary harmonics peak appears at 6 GHz. In the embodiment, a fundamental wave peak appears at about 6.5 GHz, and a secondary harmonics peak appears at 13 GHz (illustration is omitted). This is because the isolation between input terminal P1 and output terminal P2 is spoiled like FIG. 12. In the prior art, metal seal ring 15 resonates at relatively low frequency, and the fundamental wave peak and the secondary harmonics peak appear at relatively low frequency. On the other hand, in the embodiment, since resonance frequency f can be raised, the fundamental wave peak and the secondary harmonics peak are obtained at relatively high frequency.

(Composition of Semiconductor Element)

Figure 14:
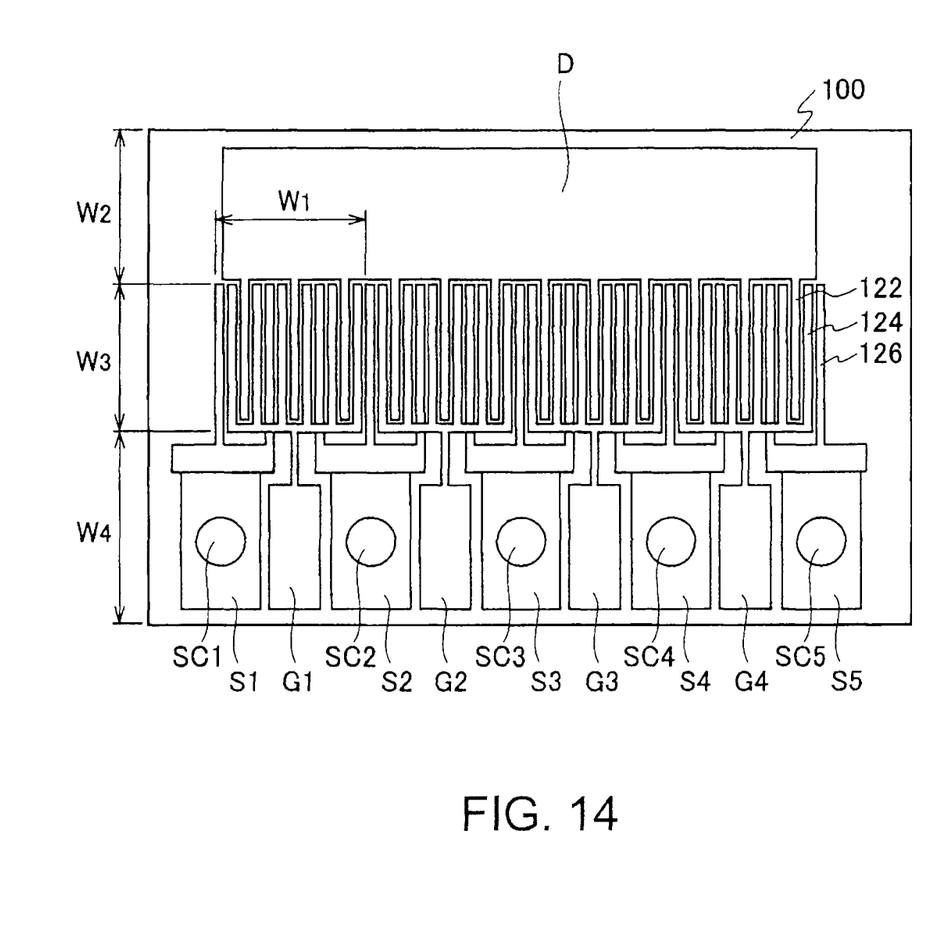
FIG. 14 is a top view illustrating an example of a semiconductor element applied to the high frequency package concerning the embodiment.

FIG. 14 is an example top view of semiconductor element 24 as applied to the high frequency package concerning the embodiment. Semiconductor element 24 includes substrate 100, gate electrode 124, source electrode 126, and drain electrode 122 which are arranged on a 1st surface of substrate 100 and have a plurality of fingers, respectively. Semiconductor element 24 is provided with gate terminal electrode G1, G2 G4; source terminal electrode S1, S2,S5; and drain terminal electrode D arranged on the 1st surface of board 100. Gate terminal electrode G1, G2 G4 are formed to bundle a plurality of fingers of gate electrode 124. Source terminal electrode S1, S2 S5 are formed to bundle a plurality of fingers of source electrode 126. And drain terminal electrode D is formed to bundle a plurality of fingers of drain electrode 122.

As for the size of each part, an example size is, cell width for W1 is about 120 micrometers, W2 is about 80 micrometers, while cell length for W3 is about 100 micrometers, and W4 is about 120 micrometers. Gate width is about 100 micrometers×6×4 cells=2.4 mm as a whole.

A ground conductor is formed on the back of substrate 100, and source terminal electrodes S1-S5 are connected with the ground conductor via holes SC1-SC5 which are formed in substrate 100. When semiconductor element 24 is mounted on conductor base plate 22 of the high frequency package, the ground conductor formed on the back of substrate 100 is electrically connected to conductor base plate 22.

Substrate 100 is a SiC substrate, a GaN substrate, a substrate with a GaN epitaxial layer being formed on a SiC substrate, a substrate with a hetero-junction epitaxial layer which consists of GaN/GaAlN is formed on a SiC substrate, a sapphire substrate, or a diamond substrate.

Gate terminal electrodes G1-G4 are connected to matching circuit 17a of input circuit board 28 arranged around semiconductor element 24 by bonding wire 30. Similarly, drain terminal electrode D is connected to matching circuit 17b of output circuit board 26 arranged around semiconductor element 24 by bonding wire 30.

(Manufacturing Method of a High Frequency Package)

A manufacturing method of the high frequency package concerning the embodiment includes: (i) a step for fixing ceramic frame 16 on conductor base plate 22 as shown in FIG. 1, FIG. 2, FIG. 3A, and FIG. 3B; (ii) a step for forming metal seal ring 15 on ceramic frame 16; and (iii) a step for forming resonance frequency adjustment conductor 12 and ceramic cap 10 on metal seal ring 15 via solder metal layer 14.

Resonance frequency adjustment conductor 12 is a gridlike conductor and is a conductor in which the metalized layer attached on the rear face of ceramic cap 10 is formed in the shape of a grid, for example. A rectangle, a circular, an ellipse, a hexagon, and an octagon are applicable to the shape of a plurality of openings 11. Resonance frequency adjustment conductors 12 and ceramic cap 10 may be formed separately.

The step for forming ceramic cap 10 forms resonance frequency adjustment conductor 12 so that opening 11 may correspond to the high portion of the loop of bonding wire 30 formed inside ceramic frame 16.

Explaining in detail furthermore, in the step for forming ceramic frame 16 on conductor base plate 22, input terminal P1 in which input stripline 18a is formed on insulating layer 20a is located between conductor base plate 22 and ceramic frame 16. The immediately mentioned construction is formed at an input part of ceramic frame 16 and output terminal P2 in which output stripline 18a is formed on insulating layer 20b is located between conductor base plate 22 and ceramic frame 16 at an output part of ceramic frame 16.

A manufacturing method of the high frequency package further includes a step for arranging semiconductor element 24 on conductor base plate 22 and inside ceramic frame 16. Additionally, it affords a step for arranging input circuit board 28 formed with input matching circuit 17a on conductor base plate 22 which is inside ceramic frame 16 adjoining to semiconductor element 24. Moreover, it includes a step for arranging output circuit board 26 formed with output matching circuit 17b on conductor base plate 22 and inside ceramic frame 16 to adjoin semiconductor device 24, a step for connecting input matching circuit 17a with input stripline 18a, a step for connecting output matching circuit 17b with output stripline 18a, a step for connecting input matching circuit 17a with semiconductor element 24 by bonding wire 30, and a step for connecting output matching circuit 17b with semiconductor device 24 by bonding wire 30. Resonance frequency adjustment conductor 12 is formed to allow opening 11 to correspond to the high portion of the loop of bonding wire 30.

Furthermore, the manufacturing method of the high frequency package may include a step for forming castellation 15a on the inner side wall of ceramic frame 16. By castellation 15a, solder metal layer 14, metal seal ring layer 15, and resonance frequency adjustment conductor 12 are grounded to conductor base plate 22.

As mentioned above, according to the present invention, a high frequency package which structure is simple, the manufacturing method is easy, and is excellent in its frequency handling characteristic, and the manufacturing method for the same are provided.

According to the embodiment, the resonance frequency of a metal seal ring is set highly, and the reflection loss and the insertion loss between the input and the output terminals at working frequency can be reduced. Therefore, the high frequency package with excellent RF characteristic in high frequency, such as a millimeter wave, and the manufacturing method for the same are provided.

As an element mounted in the high frequency ceramic package according to the present invention, not only the FET (Field Effect Transistor), but amplifying elements, such as, an HEMT (High Electron Mobility Transistor), an LDMOS (Lateral Doped Metal-Oxide-Semiconductor Field Effect Transistor), an HBT (Hetero-junction Bipolar Transistor), and an MEMS (Micro Electro Mechanical Systems) element, in addition to others, are applicable.

The high frequency package of the present invention, is applicable to broad fields, such as an internal matching type power amplifying element, a power MMIC (Monolithic Microwave Integrated Circuit), a microwave power amplifier, a millimeter wave power amplifier, and a high frequency MEMS element, etc.

Other embodiments or modifications of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. A high frequency package, comprising:
    a) a conductor base plate;
    b) a ceramic frame arranged on said conductor base plate;
    c) a metal seal ring arranged on said ceramic frame;
    d) a solder metal layer arranged on said metal seal ring;
    e) a resonance frequency adjustment conductor arranged on said solder metal layer having a plurality of openings and being electrically connected to said metal seal ring; and
    f) a ceramic cap arranged on said resonance frequency adjustment conductor.

2. The high frequency package according to claim 1, wherein said resonance frequency adjustment conductor is formed of a conductor layer metalized on a rear face of said ceramic cap.

3. The high frequency package according to claim 1, wherein said resonance frequency adjustment conductor is a grid-like conductor.

4. The high frequency package according to claim 1, wherein the shape of said opening is created as a rectangular, circular, elliptic, hexagonal, octagonal, or any other shape beneficial for the purpose.

5. The high frequency package according to claim 1, further comprising a castellation arranged at an inner side wall of said ceramic frame and connecting said metal seal ring and said conductor base plate.

6. The high frequency package according to claim 1, wherein said ceramic frame is configured to arrange a bonding wire inside thereof, and said resonance frequency adjustment conductor is configured so that said opening corresponds to a high portion of a loop of said bonding wire.

7. The high frequency package according to claim 6, further comprising:
    a) an input terminal containing an input stripline provided between said ceramic frame and said conductor base plate;
    b) an output terminal containing an output stripline provided between said ceramic frame and said conductor base plate;
    c) a semiconductor element arranged on said conductor base plate and inside said ceramic frame;
    d) an input circuit board having an input matching circuit connected to said input stripline arranged to adjoin said semiconductor element on said conductor base plate and inside said ceramic frame;
    e) an output circuit board having an output matching circuit connected to said output stripline arrange to adjoin said semiconductor element on said conductor base plate and inside said ceramic frame;
    f) said bonding wire connecting said semiconductor element and said input matching circuit, and
    g) said bonding wire connecting said semiconductor element and said output matching circuit.

8. A manufacturing method of a high frequency package, comprising:
    a) forming a ceramic frame on a conductor base plate;
    b) forming a metal seal ring on said ceramic frame; and
    c) forming a ceramic cap with a resonance frequency adjustment conductor which is a conductor having a plurality of openings on said metal seal ring via a solder metal layer.

9. The manufacturing method of the high frequency package according to claim 8, wherein forming said ceramic cap includes forming said resonance frequency adjustment conductor by forming a grid-like metalized layer on a rear face of said ceramic cap.

10. The manufacturing method of the high frequency package according to claim 8, the shape of said opening is a rectangular, circular, elliptic, hexagonal, octagonal or any other shape beneficial for the purpose.

11. The manufacturing method of the high frequency package according to claim 8, further comprising, forming a castellation electrically connecting said conductor base plate and said metal seal ring on an inner side wall of said ceramic frame.

12. The manufacturing method of the high frequency package according to claim 8, wherein forming said ceramic cap includes forming said resonance frequency adjustment conductor so that said opening corresponds to a high portion of a loop of a bonding wire arranged inside said ceramic frame.

13. The manufacturing method of the high frequency package according to claim 12, further comprising:
    a) fixing an input terminal having an input stripline between said ceramic frame and said conductor base plate at an input part of said ceramic frame;
    b) fixing an output terminal having an output stripline between said ceramic frame and said conductor base plate at an output part of said ceramic frame;
    c) forming a semiconductor element on said conductor base plate and inside said ceramic frame;
    d) forming an input circuit board having an input matching circuit to adjoin said semiconductor element on said conductor base plate and inside said ceramic frame;
    e) forming an output circuit board having an output matching circuit to adjoin said semiconductor element on said conductor base plate and inside said ceramic frame;
    f) connecting said semiconductor element and said input matching circuit by said bonding wire; connecting said semiconductor element and said output matching circuit by said bonding wire; connecting said input stripline and said input matching circuit; and
    g) connecting said output stripline and said output matching circuit.

* * * * *